(12) United States Patent
Youssef et al.

(10) Patent No.: US 9,425,832 B2
(45) Date of Patent: Aug. 23, 2016

(54) INTER CARRIER-AGGREGATION ISOLATION IN A RECEIVER

(71) Applicant: QUALCOMM Incorporated, San Diego, CA (US)

(72) Inventors: Ahmed Abdel Monem Youssef, San Diego, CA (US); Mehmet Uzunkol, San Diego, CA (US); Rui Xu, San Diego, CA (US); Ehab Ahmed Sobhy Abdel Ghany, San Diego, CA (US); Wingching Vincent Leung, San Diego, CA (US); Sang Hyun Woo, San Diego, CA (US); Allen He, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 56 days.

(21) Appl. No.: 14/255,998

(22) Filed: Apr. 18, 2014

(65) Prior Publication Data
US 2015/0200690 A1    Jul. 16, 2015

Related U.S. Application Data

(60) Provisional application No. 61/928,140, filed on Jan. 16, 2014.

(51) Int. Cl.
| | |
|---|---|
| *H04B 1/00* | (2006.01) |
| *H03F 3/195* | (2006.01) |
| *H03F 3/21* | (2006.01) |
| *H03F 3/68* | (2006.01) |

(Continued)

(52) U.S. Cl.
CPC ............... *H04B 1/006* (2013.01); *H03F 3/195* (2013.01); *H03F 3/211* (2013.01); *H03F 3/68* (2013.01); *H03F 3/72* (2013.01); *H04B 1/0057* (2013.01); *H04B 1/0067* (2013.01); *H04B 1/12* (2013.01); *H04L 5/001* (2013.01); *H04L 5/14* (2013.01); *H03F 2200/111* (2013.01); *H03F 2200/294* (2013.01); *H03F 2200/507* (2013.01); *H03F 2200/516* (2013.01); *H03F 2200/541* (2013.01); *H03F 2203/7209* (2013.01); *H03F 2203/7227* (2013.01)

(58) Field of Classification Search
USPC ........................ 455/296, 234.1; 375/345, 346
See application file for complete search history.

(56) References Cited

U.S. PATENT DOCUMENTS

| | | | | |
|---|---|---|---|---|
| 3,818,481 A | * | 6/1974 | Dorfman | H02J 13/0024 340/538.11 |
| 8,229,367 B2 | | 7/2012 | Chan et al. | |

(Continued)

FOREIGN PATENT DOCUMENTS

WO     2008145604 A1    12/2008

OTHER PUBLICATIONS

International Search Report and Written Opinion—PCT/US2015/011288—ISA/EPO—Mar. 27, 2015.

*Primary Examiner* — Edward Urban
*Assistant Examiner* — Ralph H Justus
(74) *Attorney, Agent, or Firm* — Smith Tempel Blaha LLC

(57) ABSTRACT

A device includes a first amplifier circuit coupled to a first transformer and a second transformer, the first transformer selectively coupled to a first shared power distribution network through a first switch, the second transformer selectively coupled to a second shared power distribution network through a second switch.

13 Claims, 7 Drawing Sheets

(51) Int. Cl.
  *H03F 3/72* (2006.01)
  *H04L 5/00* (2006.01)
  *H04B 1/12* (2006.01)
  *H04L 5/14* (2006.01)

(56) References Cited

U.S. PATENT DOCUMENTS

| | | |
|---|---|---|
| 8,483,627 B2 | 7/2013 | Rajendran et al. |
| 8,598,950 B2 * | 12/2013 | Khesbak ............... H03F 1/0222 330/10 |
| 2004/0215205 A1 * | 10/2004 | Plumet ................. A61B 17/155 606/102 |
| 2005/0215205 A1 * | 9/2005 | Rofougaran .................... 455/78 |
| 2007/0297156 A1 * | 12/2007 | Hosomi ................. H01L 23/50 361/763 |
| 2008/0224770 A1 | 9/2008 | Kim et al. |
| 2010/0040178 A1 * | 2/2010 | Sutton .................. H04B 7/0845 375/345 |
| 2011/0075454 A1 * | 3/2011 | Jones ...................... H02M 1/14 363/67 |
| 2013/0043946 A1 * | 2/2013 | Hadjichristos ....... H04B 1/0057 330/252 |
| 2013/0231064 A1 | 9/2013 | Gudem et al. |
| 2013/0316668 A1 | 11/2013 | Davierwalla et al. |
| 2013/0331049 A1 * | 12/2013 | Mirzaei .................... H04B 1/02 455/127.2 |
| 2014/0111275 A1 * | 4/2014 | Khlat ....................... H03F 3/24 330/124 R |
| 2015/0070097 A1 * | 3/2015 | Bauer .................. H03F 1/0227 330/296 |
| 2015/0097520 A1 * | 4/2015 | Lin ......................... H02J 7/025 320/108 |

* cited by examiner

INTER CARRIER-AGGREGATION ISOLATION IN A RECEIVER

RELATED APPLICATION

The present application claims priority to and the benefit of the filing date of U.S. Provisional Application No. 61/928,140, entitled "A Method To Improve Inter CA Isolation In An LTE-A Receiver" filed on Jan. 16, 2014, the entirety of which is incorporated into this document by reference.

BACKGROUND

1. Field

The present disclosure relates generally to electronics, and more specifically to transmitters and receivers.

2. Background

In a radio frequency (RF) transceiver, a communication signal is developed, upconverted, amplified and transmitted by a transmitter and is received, amplified, downconverted and recovered by a receiver. In the receiver, the communication signal is typically received and downconverted by receive circuitry including a filter, an amplifier, a mixer, and other components, to recover the information contained in the communication signal. A single transmitter or receiver can be configured to operate using multiple transmit frequencies and/or multiple receive frequencies. For a receiver to be able to simultaneously receive two or more receive signals, the concurrent operation of two or more receive paths is used. Such systems are sometimes referred to as "carrier-aggregation" (CA) systems. The term "carrier-aggregation" may refer to systems that include inter-band carrier aggregation (Inter-CA) and intra-band carrier aggregation (Intra-CA). Intra-CA refers to the processing of two or more separate (either contiguous or non-contiguous) carrier signals that occur in the same communication band. The carrier aggregated RF signal is typically down-converted using one or more distinct local oscillator (LO) frequencies, which generally employs a low noise amplifier (LNA) having a single RF input and multiple RF outputs to process the multiple carriers present in the Intra-CA RF signal.

State-of-the-art transceiver design focuses on reducing the total number of pins to be cost competitive. Such trends will reduce the number of power supply and ground pins, and will likely drive the circuit architecture toward using shared low dropout (LDO) voltage regulators for reducing the number of power pins needed to power the various amplifiers in the transceiver. State-of-the-art transceiver design focuses on integrating more concurrently operating systems which will aggregate coupling between and among these systems and demand innovative circuit and signal isolation strategies.

The use of an LDO power supply and its shared power distribution network dictates that the isolation between the LDO for a first carrier, CA1 and the LDO for a second carrier CA2 be robust. Normally, an LDO and related shared power distribution network do not provide good isolation at high frequencies. Therefore, a signal isolation solution that allows an LDO power system to be employed, without reliance on decoupling capacitors to improve the isolation at high frequencies is needed.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used herein, the terms "jammer," "jammer signal," "interfering signal," "TX jammer," and "TX jammer signal" refer to any signal received by receive circuitry that desensitizes the receiver, or that interferes with or hinders the reception and recovery of an information signal received in a receiver.

As used herein, the terms "desired signal," "received information signal" "receive signal," and "receiver signal," refer to a communication signal received in a receiver and containing information sought to be recovered by a receiver.

As used herein, the term "spurious signal" and "spur" refers to unwanted signal energy that overcomes a filter and is present in and interferes with the reception of a desired signal in a communication channel.

Exemplary embodiments of the disclosure are directed toward an inter carrier-aggregation (inter-CA) isolation architecture that improves isolation between carriers in a receiver that can be implemented in a shared power distribution system to provide power to one or more of an amplifier, a power amplifier, a low noise amplifier (LNA), or another amplification device, while increasing isolation between inter-CA communication signals.

Figure 1:
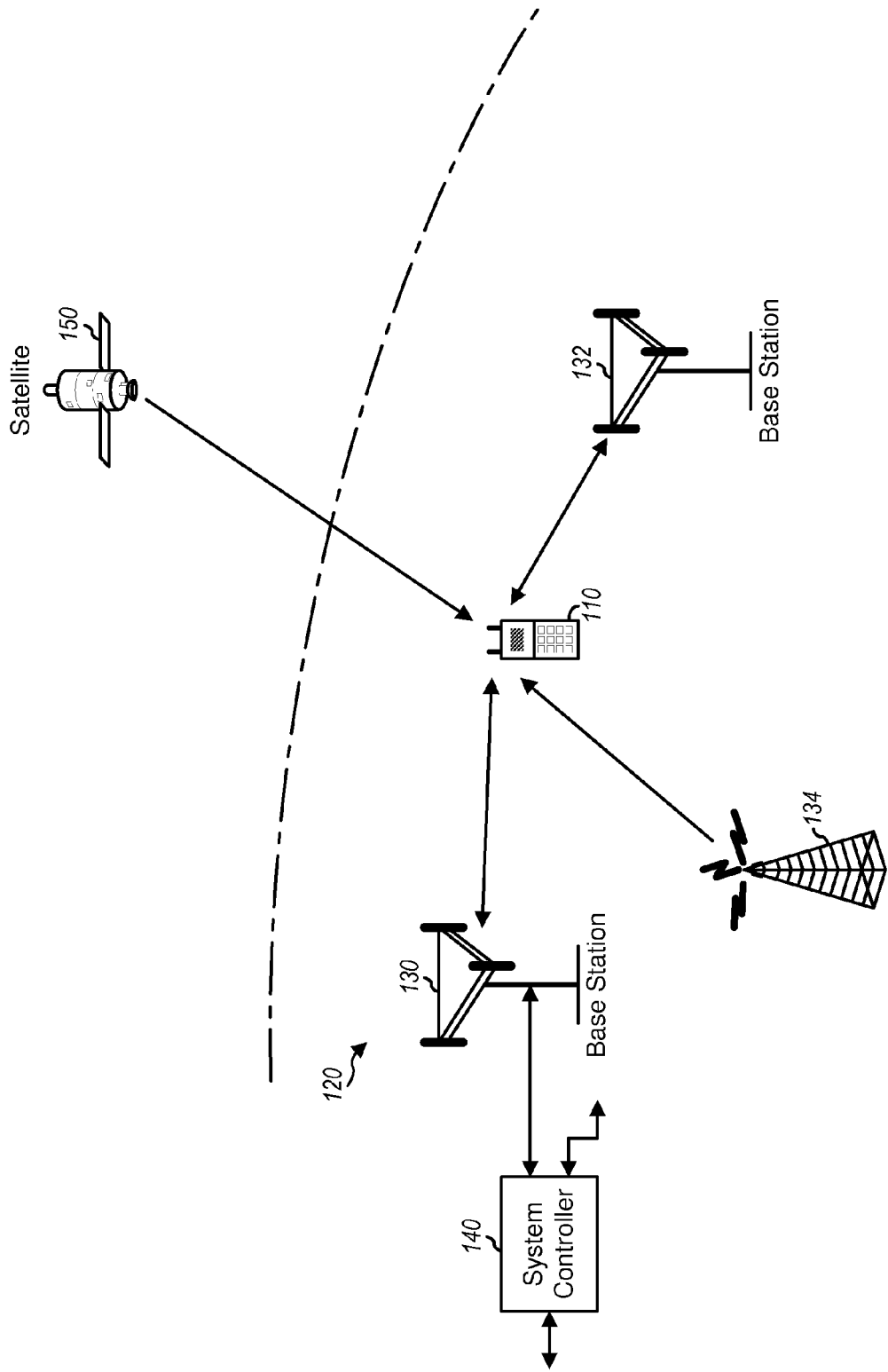
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a Wideband CDMA (WBCDMA), a wireless local area network (WLAN) system, or some other wireless system. A CDMA system may implement CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
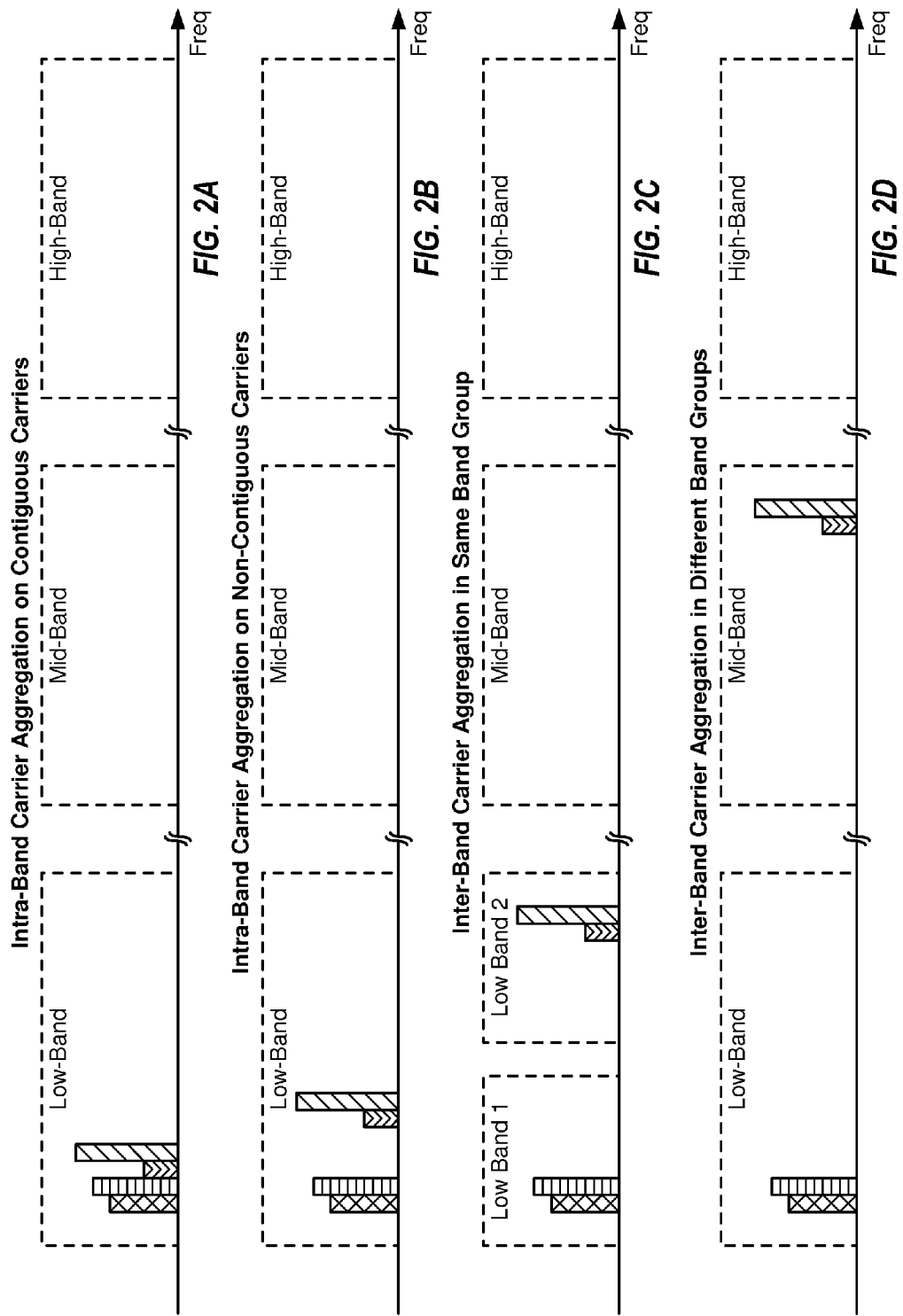
FIG. 2A is a graphical diagram showing an example of contiguous intra-band carrier-aggregation (CA).
FIG. 2B is a graphical diagram showing an example of non-contiguous intra-band CA.
FIG. 2C is a graphical diagram showing an example of inter-band CA in the same band group.
FIG. 2D is a graphical diagram showing an example of inter-band CA in different band groups.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
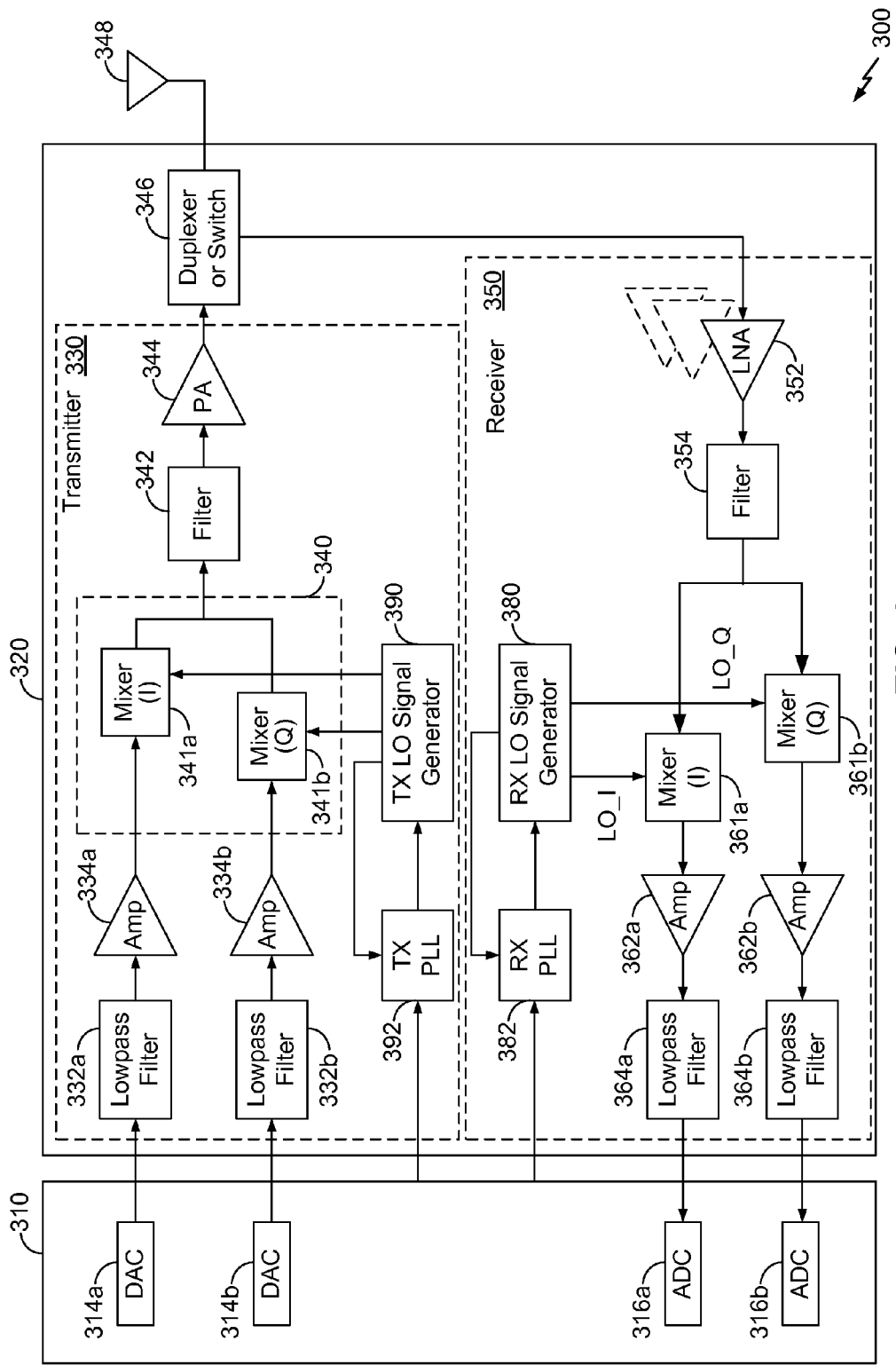
FIG. 3 is a block diagram of an exemplary design of the wireless device in FIG. 1.

FIG. 3 is a block diagram showing a wireless communication device 300 in which the exemplary techniques of the present disclosure may be implemented. FIG. 3 shows an example of a transceiver 300. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter and receiver. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Figure 4:
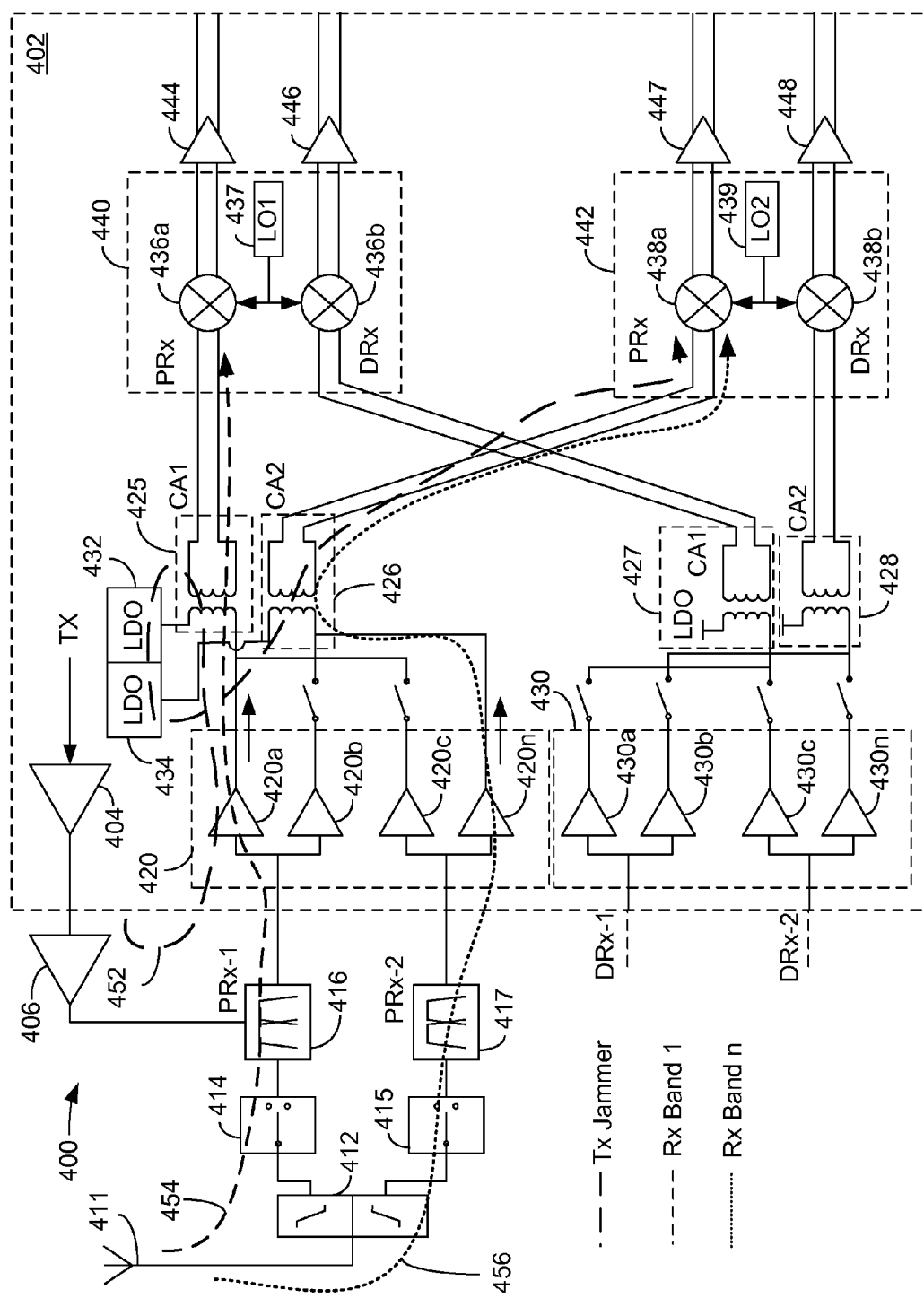
FIG. 4 is a schematic diagram illustrating an exemplary embodiment of a transceiver front-end configured to process multiple communication signals.

FIG. 4 is a schematic diagram illustrating an exemplary embodiment of a transceiver front-end configured to process multiple communication signals. The transceiver front end 402 comprises a transmit driver 404 configured to receive an information signal for transmission. The transmit driver provides the transmit signal to a power amplifier 406 for transmission through a first filter 416, a first switch 414, and a diplexer 412 to an antenna 411.

A receive signal is received at the antenna 411, provided through the diplexer 412 to the first switch 414 and the second switch 415, depending on the frequency of the received signal. The first switch 414 and the second switch 415 can be controlled by a control signal provided by, for example, the data processor 310 (FIG. 3), or another control element. In the exemplary embodiment shown in FIG. 4, the first filter 416 provides transmit signal rejection and receive band filtering, and the second filter 417 provides receive band filtering. In a carrier aggregation communication methodology, the first filter 416 may be configured to process a communication signal having a first carrier at a first frequency and the second filter 417 may be configured to process a second carrier at a second frequency.

The transceiver front end 402 also comprises a first low noise amplifier (LNA) circuit 420 and a second LNA circuit 430. The first LNA circuit 420 comprises exemplary LNAs 420a, 420b, 420c and 420n, where the "n" designation refers to an integer number of LNAs, depending on the number of frequency bands. The second LNA circuit 430 comprises exemplary LNAs 430a, 430b, 430c and 430n, where the "n" designation refers to an integer number of LNAs, depending on the number of frequency bands. In the exemplary embodiment shown in FIG. 4, the first LNA circuit 420 can be configured to receive primary receive channels and the second LNA circuit 430 can be configured to receive secondary or diversity, receive channels. Although omitted for ease of illustration, the second LNA circuit 430 is also coupled to an antenna, diplexer, switches and filters, which may be the same or different from the antenna 411, diplexer 412, first switch 414, second switch 415, first filter 416 and second filter 417. In the exemplary embodiment shown in FIG. 4, the first LNA circuit 420 and the second LNA circuit 430 are configured to operate on a single-ended communication signal. In alternative exemplary embodiment, the first LNA circuit 420 and the second LNA circuit 430 can be configured to operate on a differential communication signal.

The first LNA circuit 420 is coupled to a transformer 425 and a transformer 426. In this exemplary embodiment, the transformer 425 can be configured to process a first carrier at a first frequency and provide an output CA1 and the transformer 426 can be configured to process a second carrier at a second frequency and provide an output CA2.

The second LNA circuit 430 is coupled to a transformer 427 and a transformer 428. In this exemplary embodiment, the transformer 427 can be configured to process the first carrier at the first frequency and provide the output CA1 and the transformer 428 can be configured to process the second carrier at the second frequency and provide an output CA2. In an exemplary embodiment, the transformers 425, 426, 427 and 428 provide single-ended to differential signal conversion such that the outputs CA1 and CA2 from the transformers 425, 426, 427 and 428 are differential signals.

In an exemplary embodiment, the transformers are coupled to a shared power distribution network comprising a low dropout voltage regulator (LDO) architecture. In this exemplary embodiment, the transformers 425 and 427, configured to provide the CA1 output signal, are coupled to LDO 432; and the transformers 426 and 428, configured to provide the CA2 output signal, are coupled to LDO 434.

The transceiver front end 402 also comprises a first downconverter circuit 440 and a second downconverter circuit 442. The first downconverter circuit 440 comprises mixers 436a and 436b, which receive a first local oscillator signal (LO1) from local oscillator signal generator 437. The second downconverter circuit 442 comprises mixers 438a and 438b, which receive a second local oscillator signal (LO2) from local oscillator signal generator 439. In an exemplary embodiment, the mixers 436a and 436b process the receive signal CA1 from transformer 425 and transformer 427, and the mixers 438a and 438b process the receive signal CA2 from transformer 426 and transformer 428.

The output of the mixer 436a is provided to an amplifier 444, the output of the mixer 436b is provided to an amplifier 446, the output of the mixer 438a is provided to an amplifier 447 and the output of the mixer 438b is provided to an amplifier 448. The respective outputs of the amplifiers 444, 446, 447 and 448 are then further processed by other components within a wireless device.

One of the challenges when implementing a shared power distribution network, such as that provided by the LDO 432 and the LDO 434, is that signal coupling between inter-CA receive signals may degrade receiver performance. For example, the arrow 452 represents transmit signal energy that may overcome the filter 416 and enter the LNA 420a, proceed through the transformer 425, through the LDO circuits 432 and 434, and then enter the mixer 438a, thus making downconversion and recovery of the signal 454 on CA1 and/or the downconversion and recovery of the signal 456 on CA2 difficult.

Moreover, the power supply rejection ratio (PSRR) of the LDO 432 and the LDO 434 is relatively weak at high frequencies, generally higher than 1 GHz, thus making inter-CA isolation increasingly difficult as frequency increases.

Figure 5:
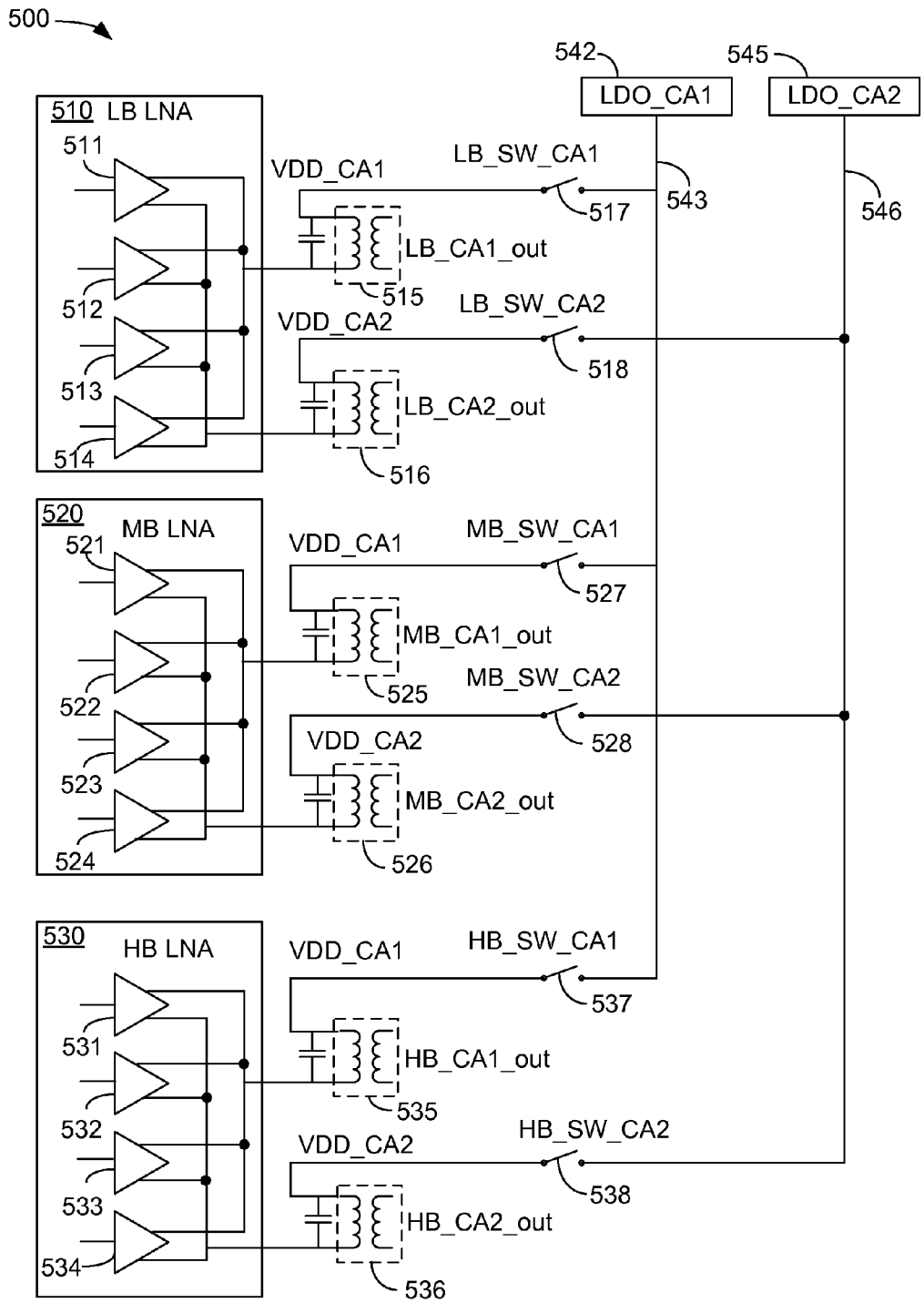
FIG. 5 is a schematic diagram illustrating an exemplary embodiment of an architecture that can improve inter-CA isolation in a receiver.

FIG. 5 is a schematic diagram illustrating an exemplary embodiment of an architecture that can improve inter-CA isolation in a receiver. The receiver portion 500 comprises a low band LNA circuit 510, a mid-band LNA circuit 520 and a high-band LNA circuit 530. In an exemplary embodiment, each LNA circuit 510, 520 and 530 comprises four LNAs. The low band LNA circuit 510 comprises LNAs 511, 512, 513 and 514. The mid-band LNA circuit 520 comprises LNAs 521, 522, 523 and 524, and the high-band LNA circuit 530 comprises LNAs 531, 532, 533 and 534. Although illustrated as single-ended devices, the LNAs in the LNA circuits 510, 520 and 530 can be implemented as differential circuits. Further, each of the LNAs in the LNA circuits 510, 520 and 530 can be configured to provide in-phase (I+ and I−) output signals and quadrature (Q+ and Q−) output signals.

The LNA circuit 510 is coupled to a load circuit implemented using a transformer for each signal path. A first low-band signal path corresponds to a first carrier CA1, which is provided to a low-band (LB) transformer 515 and a second low-band signal path corresponds to a second carrier CA2, which is provided to a low-band (LB) transformer 516. Similarly, the LNA circuit 520 is coupled to a load circuit implemented using a transformer for each signal path. A first mid-band signal path corresponds to a first carrier CA1, which is provided to a mid-band (MB) transformer 525 and a second mid-band signal path corresponds to a second carrier CA2, which is provided to a mid-band (MB) transformer 526. Similarly, the LNA circuit 530 is coupled to a load circuit implemented using a transformer for each signal path. A first high-band signal path corresponds to a first carrier CA1, which is provided to a high-band (HB) transformer 535 and a second high-band signal path corresponds to a second carrier CA2, which is provided to a high-band (HB) transformer 536.

The transformers 515, 525 and 535 associated with the CA1 outputs are all coupled to a shared power distribution network comprising a first LDO_CA1 542 and shared power network 543. Similarly, the transformers 516, 526 and 536 associated with the CA2 outputs are all coupled to a shared power distribution network comprising a second LDO_CA2 545 and shared power network 546. The capacitances shown across the primary side of the transformers 515, 516, 525, 526, 535 and 536 signify a load circuit at the output of the respective LNA circuit 510, 520 and 530. Any capacitive, resistive, inductive, or any combination thereof can comprise a load circuit.

In an exemplary embodiment, the LB CA1 transformer 515 is coupled to the shared power network 543 through a switch 517, LB_SW_CA1, and the LB CA2 transformer 516 is coupled to the shared power network 546 through a switch 518, LB_SW_CA2.

In an exemplary embodiment, the MB CA1 transformer 525 is coupled to the shared power network 543 through a switch 527, MB_SW_CA1, and the MB CA2 transformer 526 is coupled to the shared power network 546 through a switch 528, MB_SW_CA2.

In an exemplary embodiment, the HB CA1 transformer 535 is coupled to the shared power network 543 through a switch 537, HB_SW_CA1, and the HB CA2 transformer 536 is coupled to the shared power network 546 through a switch 538, HB_SW_CA2. The switches 517, 518, 527, 528, 537 and 538 can be implemented using a variety of switching technologies and, in an exemplary embodiment, can be implemented using field effect transistor (FET) switches, bipolar junction technology (BJT) switches, or switches fabricated using other switch technologies. The switches 517, 518, 527, 528, 537 and 538 can also referred to as head switches.

In an exemplary embodiment, the inter-CA isolation between receive signal paths having a first carrier CA1 and a second carrier CA2 is improved by using the switches 517, 527, and 537 to selectively couple and decouple the transformers 515, 525, 535, respectively, to and from the shared power network 543, and by using the switches 518, 528 and 538 to selectively couple and decouple the transformers 516, 526 and 536 to and from the shared power network 546.

The switches 517, 518, 527, 528, 537 and 538 can be programmed or selectively enabled and disabled so that they turn ON and OFF based on the active CA receive path. The switches 517, 518, 527, 528, 537 and 538 help overcome the CA isolation problem arising from using on-chip LDOs 542 and 545 to power the receiver circuits, and help to provide the desired isolation between active and non-active receive paths with little or no power consumption penalty. The area consumed by the switches 517, 518, 527, 528, 537 and 538 is negligible compared to the area that would be needed for decoupling capacitors at the output of the LDOs 542 and 545. The signal that controls the switches 517, 518, 527, 528, 537 and 538 is may originate from the data processor (310, FIG. 3) or from another control element.

Figure 6:
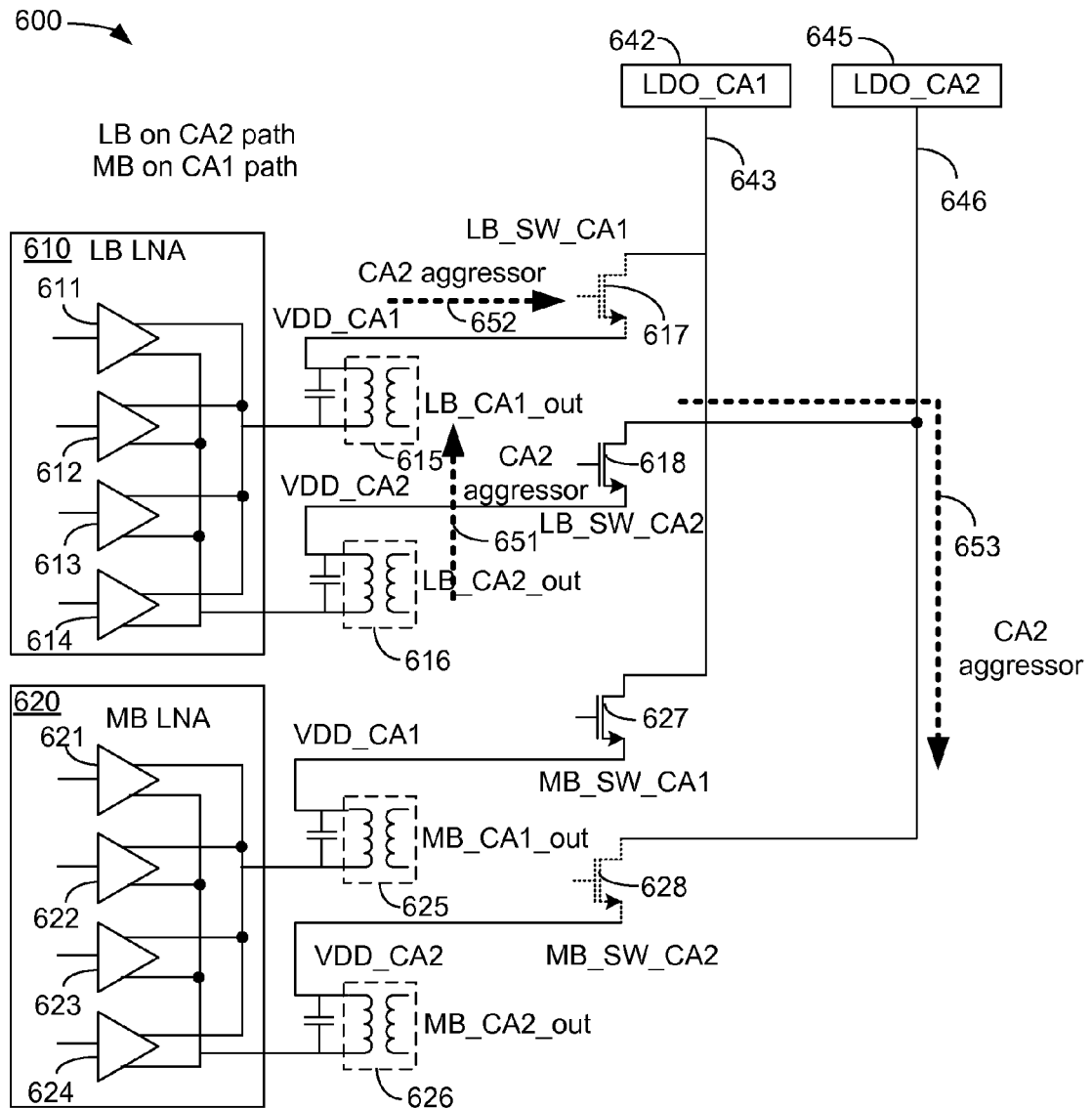
FIG. 6 is a schematic diagram illustrating an exemplary embodiment of an inter-CA isolation architecture.

FIG. 6 is a schematic diagram 600 illustrating an exemplary embodiment of an inter-CA isolation architecture. The receiver portion 600 comprises a low band LNA circuit 610 and a mid-band LNA circuit 620, which are similar to the low band LNA circuit 510 and a mid-band LNA circuit 520 described in FIG. 5. The receiver portion 600 describes the signal interaction between two receiver circuits for simplicity of illustration. The inter-CA isolation architecture described herein may be applied to any number of receiver circuits.

In an exemplary embodiment, each LNA circuit 610 and 620 comprises four LNAs. The low band LNA circuit 610 comprises LNAs 611, 612, 613 and 614. The mid-band LNA circuit 620 comprises LNAs 621, 622, 623 and 624. Although illustrated as single-ended devices, the LNAs in the LNA circuits 610 and 620 can be implemented as differential circuits. Further, each of the LNAs in the LNA circuits 610 and 620 can be configured to provide in-phase (I+ and I−) output signals and quadrature (Q+ and Q−) output signals.

The LNA circuit 610 is coupled to a load circuit implemented using a transformer for each signal path. A first low-band signal path corresponds to a first carrier CA1, which is provided to a low-band (LB) transformer 615 and a second low-band signal path corresponds to a second carrier CA2, which is provided to a low-band (LB) transformer 616. Similarly, the LNA circuit 620 is coupled to a load circuit implemented using a transformer for each signal path. A first mid-band signal path corresponds to a first carrier CA1, which is provided to a mid-band (MB) transformer 625 and a second mid-band signal path corresponds to a second carrier CA2, which is provided to a mid-band (MB) transformer 626.

The transformers 615 and 625 associated with the CA1 outputs are coupled to a shared power distribution network comprising LDO_CA1 642 and shared power network 643. Similarly, the transformers 616 and 626 associated with the CA2 outputs are coupled to a shared power distribution network comprising LDO_CA2 645 and shared power network 646. The capacitances shown across the primary side of the transformers 615, 616, 625 and 626 signify a load circuit at the output of the respective LNA circuit 610 and 620. Any capacitive, resistive, inductive, or any combination thereof can comprise a load circuit.

In an exemplary embodiment, the LB CA1 transformer 615 is coupled to the shared power network 643 through a switch 617, LB_SW_CA1, and the LB CA2 transformer 616 is coupled to the shared power network 646 through a switch 618, LB_SW_CA2.

In an exemplary embodiment, the MB CA1 transformer 625 is coupled to the shared power network 643 through a switch 627, MB_SW_CA1, and the MB CA2 transformer 626 is coupled to the shared power network 646 through a switch 628, MB_SW_CA2.

The switches 617, 618, 627 and 628 are shown in FIG. 6 as being implemented using FET transistors. A control signal is coupled to the gate of each switch 617, 618, 627 and 628. The signal that controls the switches 617, 618, 627 and 628 may originate from the data processor (310, FIG. 3) or from another control element.

In an exemplary embodiment, the inter-CA isolation between receive signal paths having a first carrier CA1 and a second carrier CA2 is improved by using the switches 617 and 627 to selectively couple and decouple the transformers 615 and 625, respectively, from the shared power network 643, and by using the switches 618 and 628 to selectively couple and decouple the transformers 616 and 626 from the shared power network 646.

The switches 617, 618, 627 and 628 can be programmed or selectively enabled and disabled so that they turn ON and OFF based on the active CA receive path. The switches 617, 618, 627 and 628 help overcome the CA isolation problem arising from using on-chip LDOs 642 and 645 to power the receiver circuits, and provide the desired isolation with little or no power consumption penalty. The area consumed by the switches 617, 618, 627 and 628 is negligible compared to the area that would be needed for decoupling capacitors at the output of the LDOs 642 and 645.

In the exemplary embodiment shown in FIG. 6, a mid-band (MB) receive signal is assigned to be on the CA1 path, the switch 627 of MB CA1 is ON and the switch 628 for CA2 is OFF. The switch 628 is shown in phantom line to indicate that it is OFF in this exemplary embodiment. The switch 628 being OFF decouples the MB CA2 transformer 626 from the LDO_CA2 645 and the shared power network 646.

In the exemplary embodiment shown in FIG. 6, a low-band (LB) receive signal is assigned to be on the CA2 path (i.e., for performing carrier aggregation between LB and MB), the switch 618 for LB CA2 is ON and the switch 617 LB CA1 is OFF. The switch 617 being OFF decouples the LB CA1 transformer 615 from the LDO_CA1_642 and the shared power network 643.

In this manner, an aggressor signal on the CA_2 path, will not disrupt a receive signal on the CA_1 path as a result of leakage through the transformers 616 or 625 or the shared power networks 643 and 646. A CA_2 aggressor signal is illustrated using arrows 651, 652 and 653. The CA_2 aggressor signal 651 illustrates signal energy leaking between the transformer 616 and the transformer 615. The CA_2 aggressor signal 652 illustrates the signal energy that has leaked through the transformer 615 that would enter the shared power network 643, but for the switch 617 being OFF. The switch 628 being OFF also prevents the CA_2 aggressor signal 653 from entering the transformer 626 and migrating to the CA1 path through coupling from the transformer 626 to the transformer 625. This signal leakage may occur due to electrical or magnetic coupling.

Similarly, the switches 618 and 627 could be OFF and the switches 617 and 628 be turned ON if the mid-band receive path is configured for the CA2_out signal and the low-band receive path is configured for the CA1_out signal. Although illustrated with a low-band receive circuit and a mid-band receive circuit, any number of receive band paths can be implemented.

Figure 7:
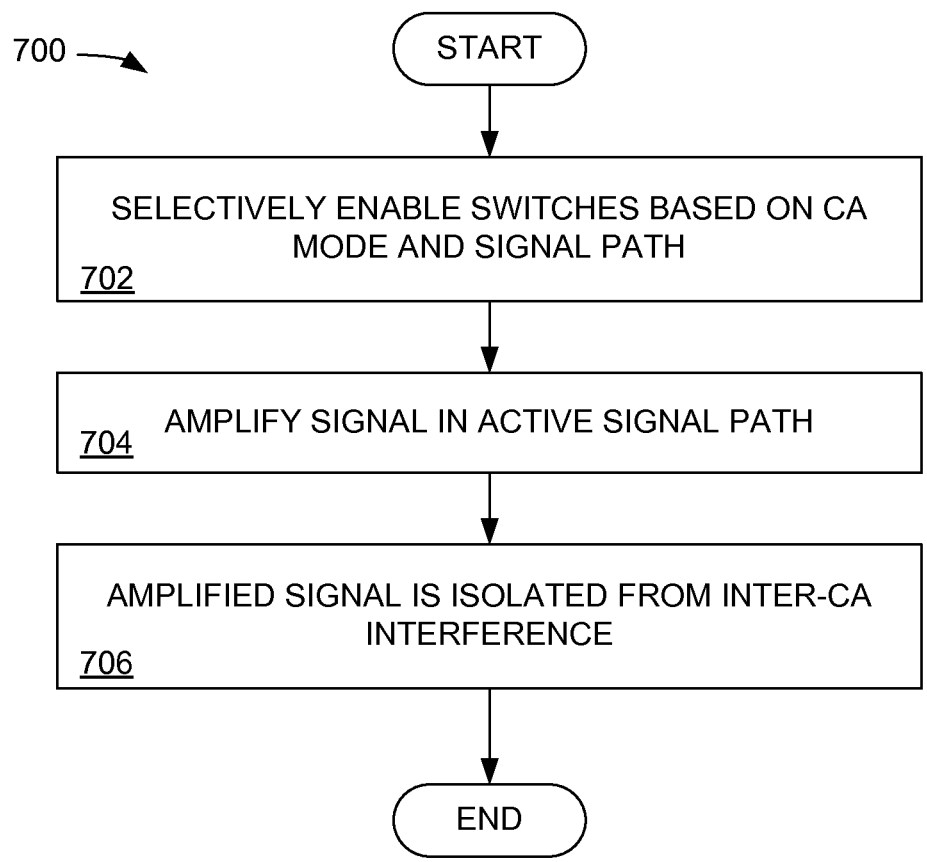
FIG. 7 is a flow chart showing an exemplary embodiment of a method for inter-CA isolation.

FIG. 7 is a flow chart showing an exemplary embodiment of a method for an inter carrier-aggregation (inter-CA) isolation.

In block 702, switches are selectively enabled to couple transformers to a power distribution network based on a selected operation mode and a selected active signal path.

In block 704, the signal is amplified in the active signal path.

In block 706, the amplified signal is isolated from inter-CA interference in the active signal path.

The inter-CA isolation architecture described herein may be implemented on one or more ICs, analog ICs, RFICs, mixed-signal ICs, ASICs, printed circuit boards (PCBs), electronic devices, etc. The inter-CA isolation architecture may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the inter-CA isolation architecture described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A device, comprising:
    a first amplifier circuit having outputs coupled to inputs of a first transformer and a second transformer, the first transformer selectively coupled to a first shared power distribution network through a first switch configured to selectively couple the first shared power distribution network to the first transformer, the second transformer selectively coupled to a second shared power distribution network through a second switch configured to selectively couple the second shared power distribution network to the second transformer, each of the first and second shared power distribution networks shared with one or more other transformers.

2. The device of claim 1, wherein the first switch is configured to couple the first transformer to the first shared power distribution network and the second switch is configured to decouple the second transformer from the second shared power distribution network.

3. The device of claim 1, wherein the first switch is configured to decouple the first transformer from the first shared power distribution network and the second switch is configured to couple the second transformer to the second shared power distribution network.

4. The device of claim 2, wherein the first switch is configured to couple the first transformer to the first shared power distribution network when the first transformer is configured to generate an output and the second switch is configured to decouple the second transformer from the second shared power distribution network when the second transformer is not configured to generate an output.

5. The device of claim 3, wherein the first switch is configured to decouple the first transformer from the first shared power distribution network when the first transformer is not configured to generate an output and the second switch is configured to couple the second transformer to the second shared power distribution network when the second transformer is configured to generate an output.

6. The device of claim 1, wherein the first amplifier circuit is configured to amplify a first carrier-aggregation (CA) signal or a second carrier-aggregation (CA) signal.

7. The device of claim 1, further comprising:
    a second amplifier circuit coupled to a third transformer and a fourth transformer, the third transformer selectively coupled to the first shared power distribution network through a third switch, the fourth transformer selectively coupled to the second shared power distribution network through a fourth switch;
    the first and third switches are configured to selectively couple one of the first transformer or the third transformer having a first carrier-aggregation (CA) signal to the first shared power distribution network; and
    the second and fourth switches are configured to selectively couple one of the second transformer or the fourth transformer having a second carrier-aggregation (CA) signal to the second shared power distribution network.

8. The device of claim 1, wherein the first amplifier circuit comprises a low noise amplifier circuit.

9. The device of claim 7, wherein the first carrier-aggregation (CA) signal is located in a first communication band and the second carrier-aggregation (CA) signal is located in a second communication band.

10. A method comprising:
    selectively coupling a first transformer to a first shared power distribution network through a first switch and a second transformer to a second shared power distribution network through a second switch based on a carrier-aggregation mode, each of the first and second shared power distribution networks shared with one or more other transformers; and
    amplifying a first carrier-aggregation (CA) signal and a second carrier-aggregation (CA) signal by a first amplifier circuit having outputs coupled to inputs of the first transformer and the second transformer, the selective coupling isolating the first CA signal from the second CA signal.

11. The method of claim 10, wherein the selective coupling decouples a transformer from a shared power distribution network when the transformer is not generating an output signal.

12. The method of claim 10, wherein the selective coupling couples a transformer to a shared power distribution network when the transformer is generating an output signal.

13. The method of claim 10, wherein the first CA signal is associated with the first transformer, the second CA signal is associated with the second transformer and the selective coupling isolates the first transformer from the second transformer.

* * * * *